(12) United States Patent
Miyahara

(10) Patent No.: US 6,351,044 B1
(45) Date of Patent: *Feb. 26, 2002

(54) COOLING APPARATUS FOR AN ELECTRONIC DEVICE INTEGRALLY FORMED WITH A CIRCUIT BOARD

(75) Inventor: Masaharu Miyahara, Nakatsu (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/229,744

(22) Filed: Jan. 14, 1999

(30) Foreign Application Priority Data

Jan. 22, 1998 (JP) .............................. 10-010208

(51) Int. Cl.[7] .............................. H02K 9/60; H02K 9/04; H02K 9/08
(52) U.S. Cl. ...................... 310/52; 310/DIG. 6; 310/62; 361/695
(58) Field of Search ............................ 320/DIG. 6, 268, 320/86, 62, 63; 361/695, 697; 165/80.2, 80.3; 310/52, 58

(56) References Cited

U.S. PATENT DOCUMENTS

| | | | | |
|---|---|---|---|---|
| 4,620,139 A | * | 10/1986 | Egami et al. | 318/254 |
| 4,804,574 A | * | 2/1989 | Osawa et al. | 428/209 |
| 4,885,488 A | * | 12/1989 | Cox | 310/68 R |
| 5,272,599 A | * | 12/1993 | Koenen | 361/710 |
| 5,644,183 A | * | 7/1997 | Van Loenen et al. | 310/268 |
| 5,731,953 A | * | 3/1998 | Sakurai | 361/695 |
| 5,879,141 A | * | 3/1999 | Yokozawa et al. | 417/423.7 |

FOREIGN PATENT DOCUMENTS

| | | | | |
|---|---|---|---|---|
| JP | 58-190257 | * | 11/1983 | 310/DIG. 6 |
| JP | 2-269451 | * | 11/1990 | 310/63 |
| JP | 7111302 | | 4/1995 | |

OTHER PUBLICATIONS translation of JP 2–269,451, Nov. 1990.*

* cited by examiner

Primary Examiner—Karl Tamai
(74) Attorney, Agent, or Firm—Stevens, Davis, Miller & Mosher, LLP (57) ABSTRACT

A cooling apparatus integrally formed within a casing for an electronic device. A mounting board has heat generating members and the cooling apparatus mounted thereto. In an embodiment, a cooling fan having a flat motor is integrally formed with the mounting board by directly fixing a stator coil and a bearing of a motor on the mounting board. The reduced thickness of this structure permits the circuit element to be arranged on the bottom side of the mounting board, permitting increased surface area for the mounting of components of the electronic device. In another embodiment, the mounting board is made of multiple layers, and the field coils form a flat stator on the multiple layers of the mounting board. A bearing is integrally formed in the multiple layers of the mounting board. The rotor is spaced over the mounting board and opposes the flat stator which is integral with the mounting board to reduce the thickness of the motor and permit use of the mounting bottom of the mounting board for components of the electronic device.

16 Claims, 5 Drawing Sheets

COOLING APPARATUS FOR AN ELECTRONIC DEVICE INTEGRALLY FORMED WITH A CIRCUIT BOARD

BACKGROUND OF THE INVENTION

1. Field of the Invention

The present invention relates to a cooling apparatus for an electronic device having a thin machine body such as a mobile computer, a digital video camera and the like.

2. Description of the Prior Art

Figure 5:
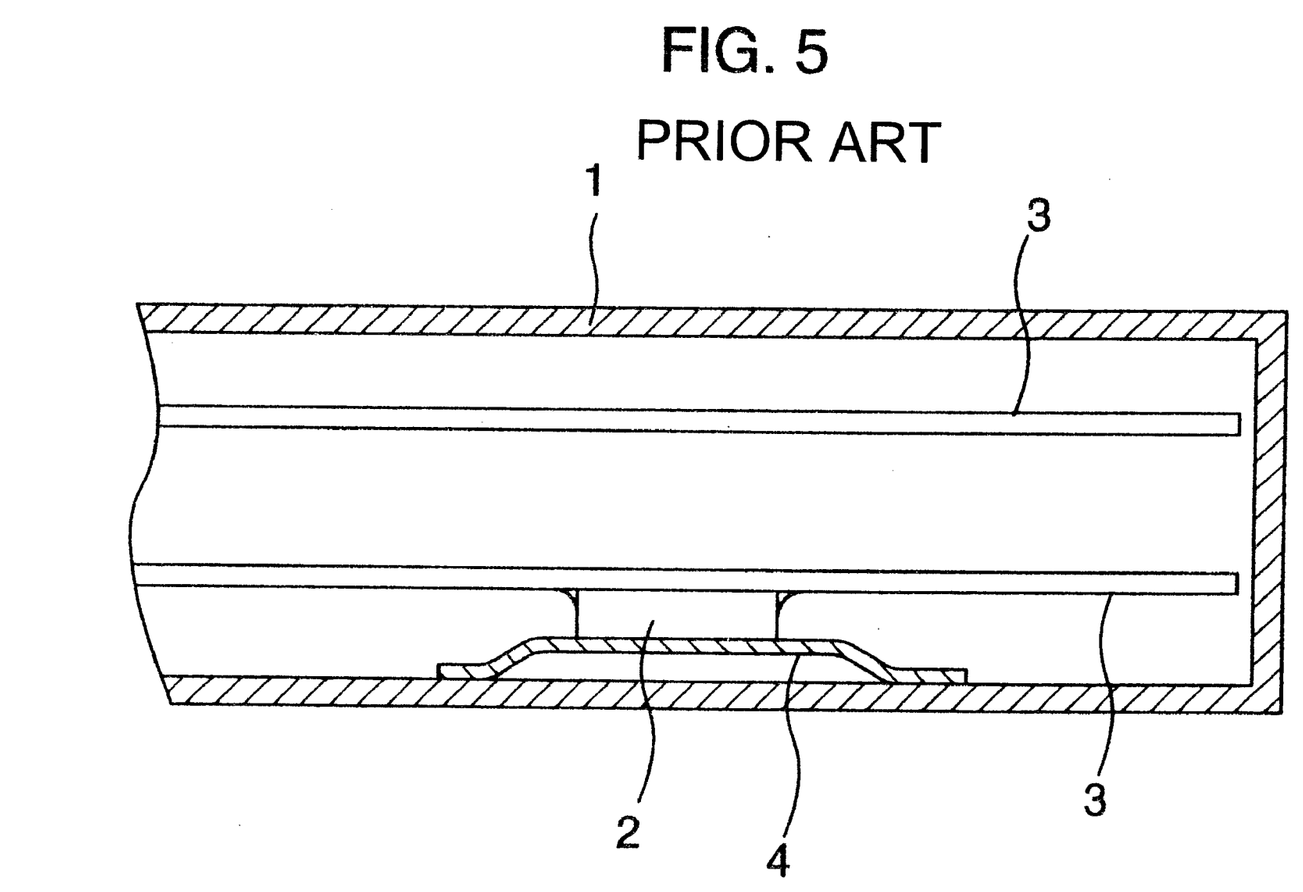
FIG. 5 is a cross sectional view of an electronic device provided with a cooling fan in accordance with a conventional embodiment.

Conventionally, the thin electronic device of this kind is structured such that a mounting board 3 mounting a heat-generating circuit part 2 such as a semiconductor, a CPU and the like is arranged within a casing 1 as shown in FIG. 5, and a heat generated by the circuit part 2 is discharged out of the device via a heat transmission member 4 made of an aluminum plate or the like.

Here, in a heat discharge amount to an outer portion due to a heat transmission, the following relation (1) is established.

$$Qout \; \Sigma(Tsi-Ta) \times Si \qquad (1)$$

Qout: heat discharge amount

Tsi: temperature of a fine portion at i number when separating a surface of the casing into fine portions Si: area of the fine portion at i number mentioned above Ta: temperature of the open air Accordingly, the temperature of the casing increases as a calorific power of the heat generating part to be cooled increases, and an area of a portion having a high temperature becomes widened in accordance therewith.

In accordance with the structure mentioned above, since the electronic device such as a mobile computer or a digital video camera is used by being held by a hand, an increase of the temperature of the surface of the casing gives an uncomfortable feeling to a user and may cause problems with of the device in some cases.

In this view, there has been developed an electronic device in which a fan is provided within the electronic device so as to forcibly discharge the heat generated within the casing to an outer portion.

Figure 6:
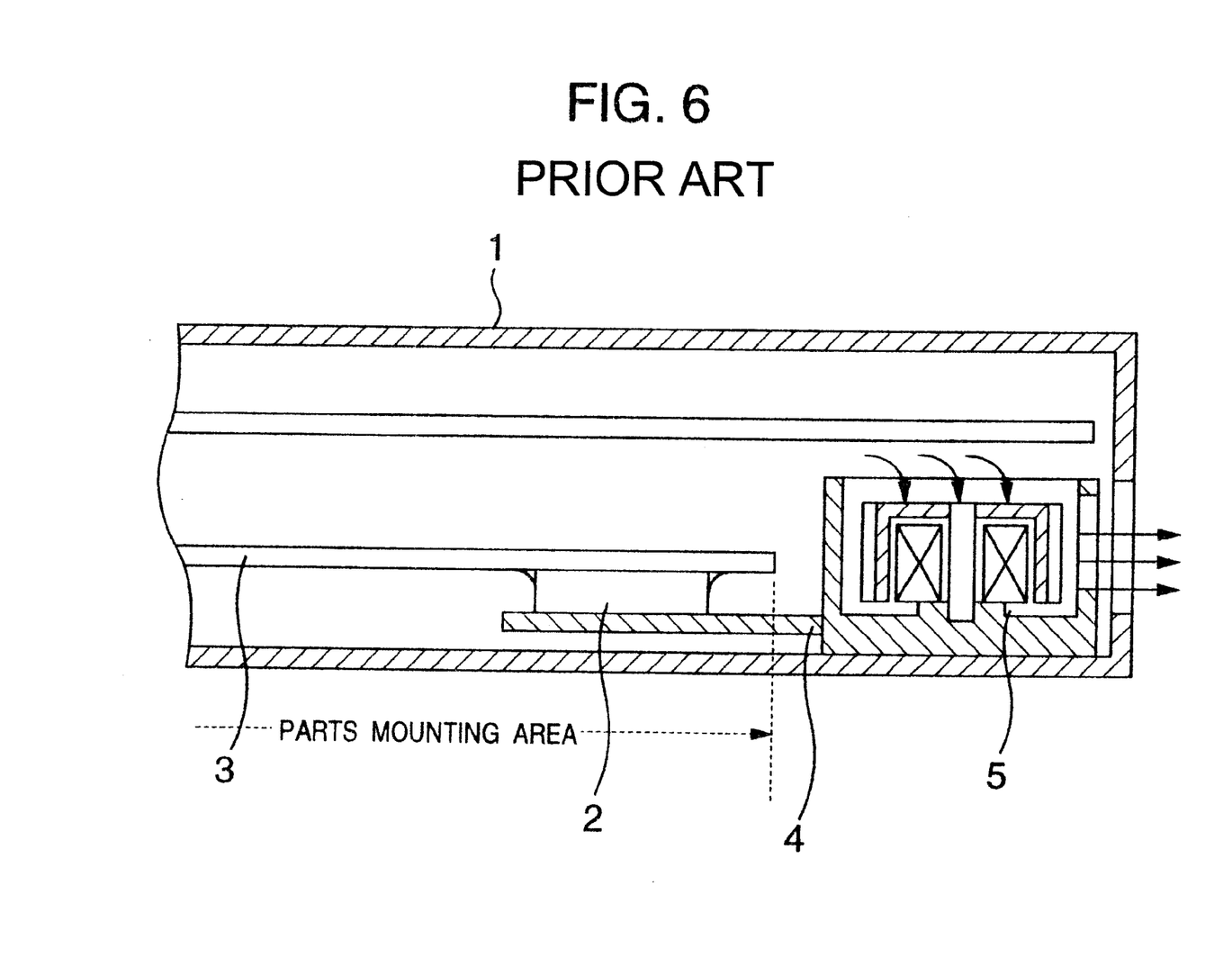
FIG. 6 is a cross sectional view of an electronic device provided with a cooling fan in accordance with another conventional embodiment.

FIG. 6 shows an embodiment of the electronic device provided with a cooling fan. The electronic device is structured such as to arrange a plurality of mounting boards 3 mounting heat-generating circuit parts 2 such as semiconductors and the like within the casing 1. The electronic device is further structured such as to shorten a length of the mounting board 3 in a side of an inner bottom within the casing 1 so as to form a space with respect to a side surface of the casing 1, to arrange a flat type cooling fan 5 having a frame serving as a heat sink in the space so that a minimum size thereof corresponds to a direction of thickness of the device, to transmit a heat generated in the circuit parts 2 to the cooling fan 5 via a heat transmission member 4 made of an aluminum or the like, and to forcibly discharge the heat out of the device body by an operation of the cooling fan 5.

In a thin note type personal computer, the structure mentioned above is frequently employed, and it is desired to design a thin type electronic device so as to secure a sufficient reliability, to restrict a height of the cooling fan 5 to about 7.5 mm and to set a thickness of the device within 20 mm.

However, the electronic device shown in FIG. 6 has the following problems.

That is, in the case of the electronic device such as the mobile type personal computer having a significantly thin thickness, it is desired to further reduce the height of the cooling fan and reduce the occupied space in a direction of the thickness, so that it is hard that the device using the normal motor, for example, an outer rotor type motor satisfies the desire.

Further, when the mounting portion is constituted by two sheets of mounting boards having a size of 50 mm×100 mm, the parts mounting area is expressed by the following formula.

$$50 \; mm \times 100 \; mm \times 2 \; (surfaces) \times 2 \; (sheets) = 20000 \; mm^2$$

When one of the mounting boards 3 is notched for arranging the cooling fan 5, a non-mounting area is expressed by the following formula since the size of the cooling fan 5 is 40 mm×40 mm.

$$40 \; mm \times 40 \; mm \times 2 \; (surfaces) = 3200 \; mm^2$$

Accordingly, the parts mounting area is reduced by 16%.

This causes a great limitation for designing an electronic device having a compact size, a high performance and a high function.

SUMMARY OF THE INVENTION

An object of the present invention is to provide a cooling apparatus for an electronic device provided with a cooling fan having a compact size, a high performance and a high function, which can structure the cooling fan so as to reduce an occupied space in a direction of a thickness, to be easily assembled and reduce a parts mounting area as less as possible, thereby securing a thinness of the electronic device.

In order to achieve the object of the present invention, in accordance with the present invention, there is provided a cooling apparatus for an electronic device comprising a mounting board mounting electronic parts including heat generating parts such as semiconductors and arranged within a casing of a thin type electronic device such as a mobile personal computer and a digital video camera, and a cooling fan installed therein, wherein a flat cooling fan is constituted by a motor comprising a flat stator and a flat rotor opposing to a surface of the flat stator, a vane provided in the flat rotor of the motor and a frame, the cooling fan is arranged within the casing so that a height direction thereof corresponds to a direction of a thickness of the casing, and the heat generating parts on the mounting board and a frame of the cooling fan are thermally connected by a heat transmission member.

As mentioned above, since the structure is made such that the height of the cooling fan can be reduced to a significantly low level, the cooling fan can be easily assembled within the thin type casing and arranged on a partial surface of the mounting board, so that the electronic device with the cooling fan having a compact size, a high performance and a high function can be achieved without greatly reducing the area of mounting the parts on the mounting board and the heat generated by the heat generating parts within the electronic device can be sufficiently radiated so as to cool the heat generating parts. Accordingly, in the electronic device provided with the cooling apparatus such as the mobile type personal computer, the digital video camera and the like, the thin structure can be realized without reducing the cooling effect and without reducing the area for mounting the parts.

DESCRIPTION OF THE PREFERRED EMBODIMENTS

First Embodiment

An embodiment in accordance with the present invention will be described below with reference to the accompanying drawings.

Figure 1:
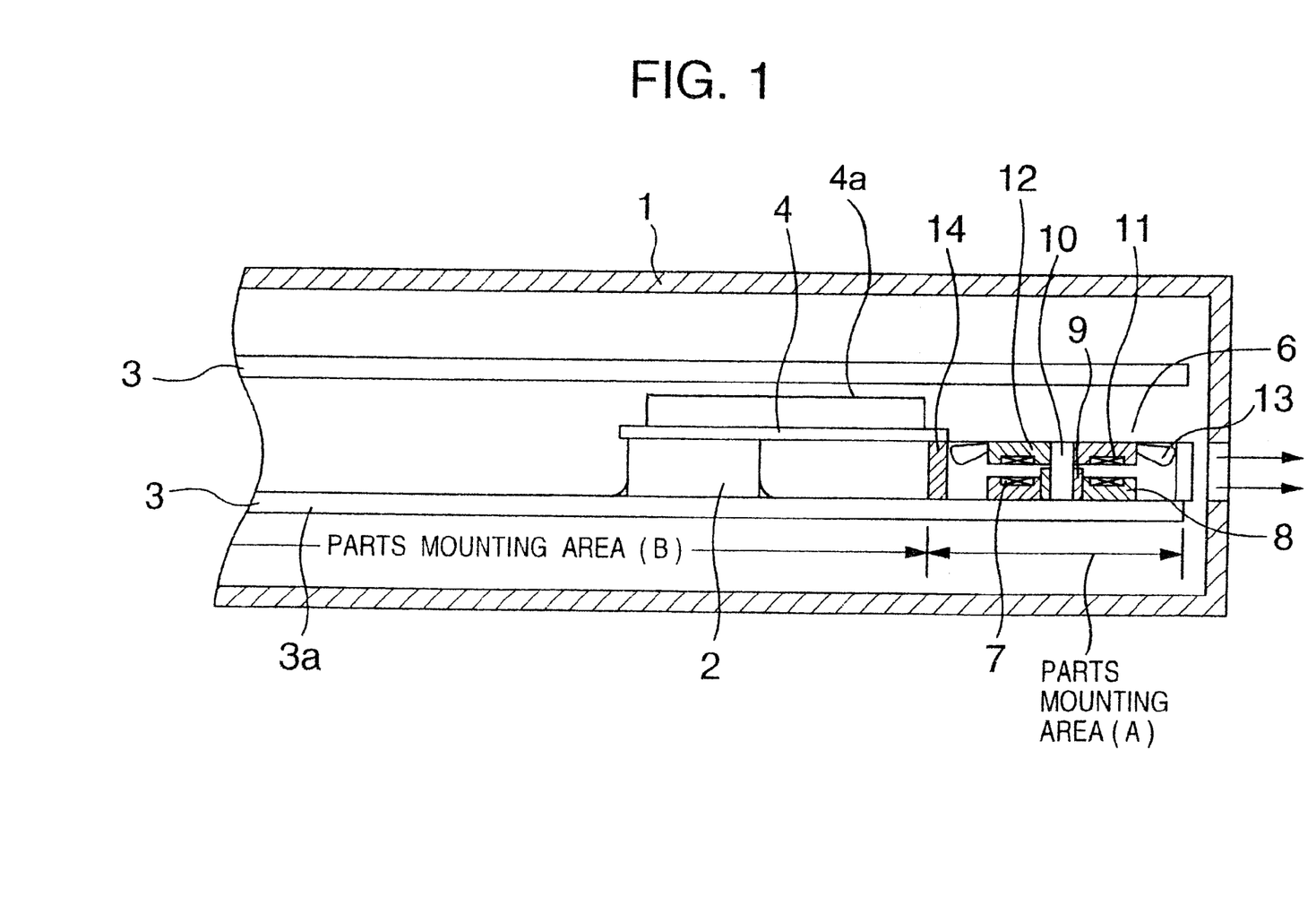
FIG. 1 is a cross sectional view of a main portion of an electronic device provided with a cooling fan in accordance with a first embodiment of the present invention.

FIG. 1 is a cross sectional view of a main portion of an electronic device provided with a cooling fan in accordance with a first embodiment of the present invention.

In FIG. 1, reference numeral 1 denotes a thin type casing for an electronic device in which circuit parts such as semiconductors, resistances, condensers and the like, functional parts such as switches, connectors and the like, and electronic apparatuses such as a floppy apparatus, a hard disc apparatus and the like are arranged, and the casing 1 is made of a metal or a resin material. Reference numeral 3 denotes a mounting board arranged within the casing 1 so as to form multiple steps, and reference numeral 3a denotes a mounting board disposed at a lowermost portion in a direction of a thickness of the casing 1 among the mounting boards 3. Heat generating circuit parts 2 such as the semiconductors and the like are mounted on the mounting board 3a, and a flat cooling fan 6 is bonded and fixed to a portion near an end portion of the mounting board 3a.

The cooling fan 6 is constituted by a motor portion comprising a flat stator 8 formed by molding a field coil 7, a rotational axis 10 rotatably held on a center portion of the flat stator 8 by a bearing 9, a flat rotor 12 formed by molding a permanent magnet 11 and opposing to the flat stator 8, vanes 13 mounted to the flat rotor 12 so as to constitute a fan portion and a frame 14 made of a heat transmission material such as an aluminum and the like, surrounding the motor and an outer side of the fan portion, having an air suction port at an upper opening and provided with at least one air discharge port in a side wall, thereby being formed in a flat shape. The frame 14 is bonded and fixed to the mounting board 3a by an adhesive. Alternatively, the frame 14 is arranged and fixed to the mounting board 3a by forming a projection on a bottom surface of the frame 14 and a hole at a position corresponding to the projection of the mounting board 3a so as to press the projection of the frame 14 into the hole.

The heat generating circuit parts 2 and the frame 14 are connected to each other via a heat transmission member 4 made of a material having a good heat transmission such as an aluminum and the like. The heat transmission member 4 is not limited to a metal, and a carbon material such as a graphite and the like and a resin material may be used as far as they have a good heat transmission. The circuit parts 2 and the heat transmission member 4 are bonded and fixed to each other by an adhesive. Further, a heat transmission resin such as a grease, a silicone oil and the like are applied to a portion between the circuit parts 2 and the heat transmission member 4, and an adhesion between the circuit parts 2 and the heat transmission member 4 is increased, so that the heat transmission member 4 may be held between the circuit parts 2 by a clip or the like, or the heat transmission member 4 and the circuit parts 2 may be overlapped and fixed to the mounting board 3a by a pin or the like. On the contrary, the heat transmission member 4 and the frame 14 are fixed to each other by an adhesion by an adhesive, a screwing, a welding or the like. Further, the heat transmission member 4 corresponds to a member formed by extending a part of the frame 14, and may be integrally formed with the frame 14 or may be a frame cover. Further, in accordance with this embodiment, the heat transmission member 4 is formed in a flat plate shape, however, fins 4a may be provided on the heat transmission member 4.

In the structure mentioned above, a heat generated by the circuit parts 2 mounted on the mounting board 3a is transmitted to the frame 14 of the cooling fan 6 via the heat transmission member 4. Then, the vane 13 is rotated by operating the cooling fan 6, so that an air is sucked from an opening in an upper side of the frame 14, a heat of the frame 14 is exchanged with a wind generated by the sucked air, and a hot wind absorbing the heat is discharged out of the casing 1 through a discharge port for an air in the frame 14. The circuit parts 2 on the mounting board 3a are cooled by this operation, so that the temperature of the casing 1 in the electronic device is prevented from being increased.

In this case, the cooling fan 6 is structured such that a height in a direction of the thickness of the casing 1 is significantly reduced by the flat stator 8 and the flat rotor 12 so as to be applied to the thin electronic device, thereby being constituted as a flat type cooling fan. Accordingly, an occupied space within the casing 1 can be reduced so as to be easily assembled, and even when the mounting board 3 is mounted so as to form multiple steps, the cooling fan can be mounted on one of the mounting boards 3a.

Further, since the mounting board 3a to which the cooling fan 6 is mounted can mount the circuit parts on a surface in the side where the cooling fan 6 is not mounted, the parts mounting area is not greatly reduced. That is, as shown in FIG. 1, in the case that the conventional flat-shaped cooling fan is mounted, both surfaces of a parts mounting area (B) can be used, however, on the contrary, in accordance with the first embodiment, one surface of a parts mounting area (A) is added. Accordingly, since the number of the mounting parts is increased, the electronic device can be made one having a high performance and a high function and provided with a cooling fan. Further, since a lot of parts can be mounted in the same space, the electronic device can be made compact.

Here, in accordance with the first embodiment, it is structured such that the cooling fan 6 is arranged on the mounting board 3, however, it may be structured such that the cooling fan 6 is directly arranged inside the casing 1, and in this case, it is possible to further widen the parts mounting area of the mounting board 3.

Second Embodiment

Figure 2A:
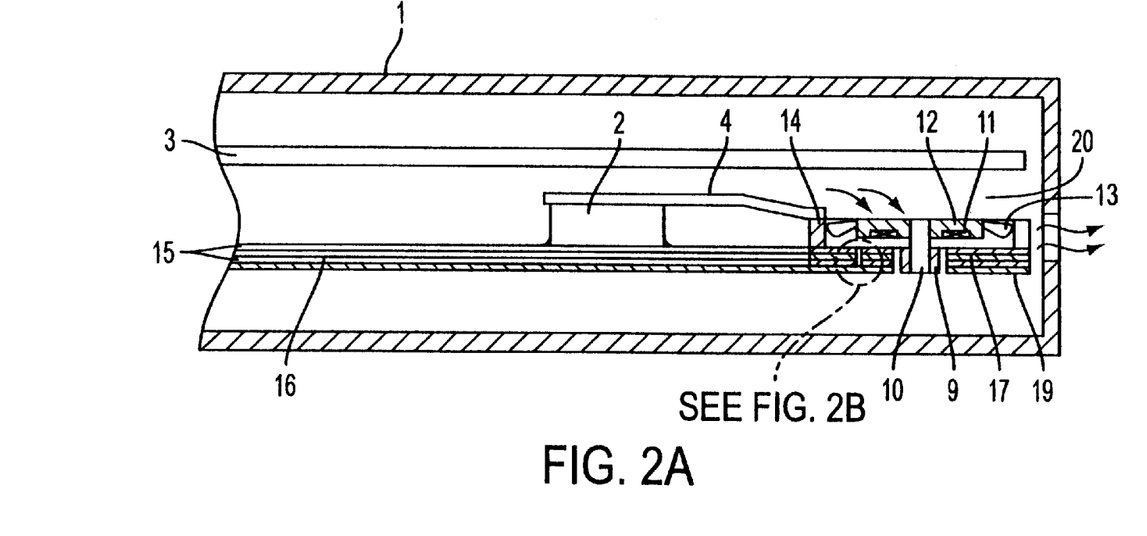
FIG. 2A is a cross sectional view of a main portion of an electronic device provided with a cooling fan in accordance with a second embodiment of the present invention.
Figure 2B:
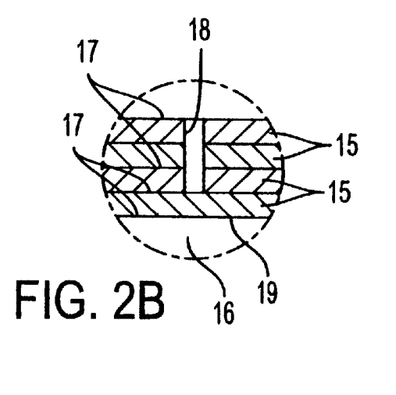
FIG. 2B shows a detail of FIG. 2A.

FIG. 2A is a cross sectional view of a main portion in a cooling apparatus for an electronic device in accordance with a second embodiment of the present invention. FIG. 2B shows details of FIG. 2A.

The cooling apparatus for the electronic device in accordance with the second embodiment is characterized in that the flat stator of the motor portion in the cooling fan is constituted by utilizing the mounting board 3.

That is, reference numeral 3 denotes a mounting board, and at least a board on which a cooling fan 20 is provided among the mounting boards 3 is constituted by a multiple layered mounting board 16 obtained by integrally overlapping a plurality of printed circuit boards 15, and a field coil 17 is formed at a predetermined position of each of the printed circuit boards 15 by printing and etching. Then, each of the field coils 17 is connected by a through hole 18 so as to constitute a flat stator 19. Reference numeral 9 in the drawing denotes a bearing, which is pressed into the multiple layered mounting board 16 and fixed thereto. Reference numeral 10 denotes a rotational axis, reference numeral 11 denotes a permanent magnet, reference numeral 13 denotes a vane and reference numeral 14 denotes a frame. Since these elements are combined in the same manner as that of the first embodiment mentioned above so as to constitute the cooling fan 20, an explanation thereof will be omitted.

Figure 3:
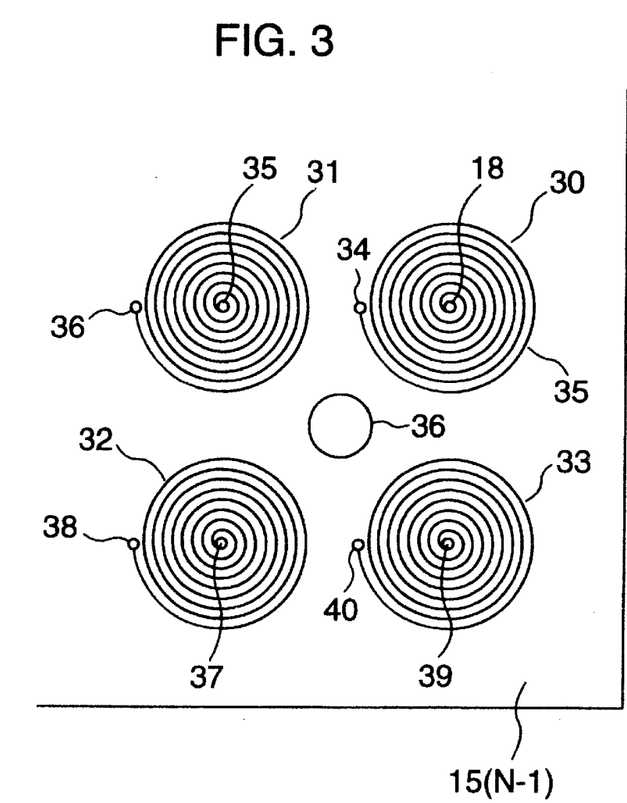
FIG. 3 is a pattern diagram of a field coil in the cooling apparatus of the electronic device in accordance with the second embodiment of the present invention.
Figure 4:
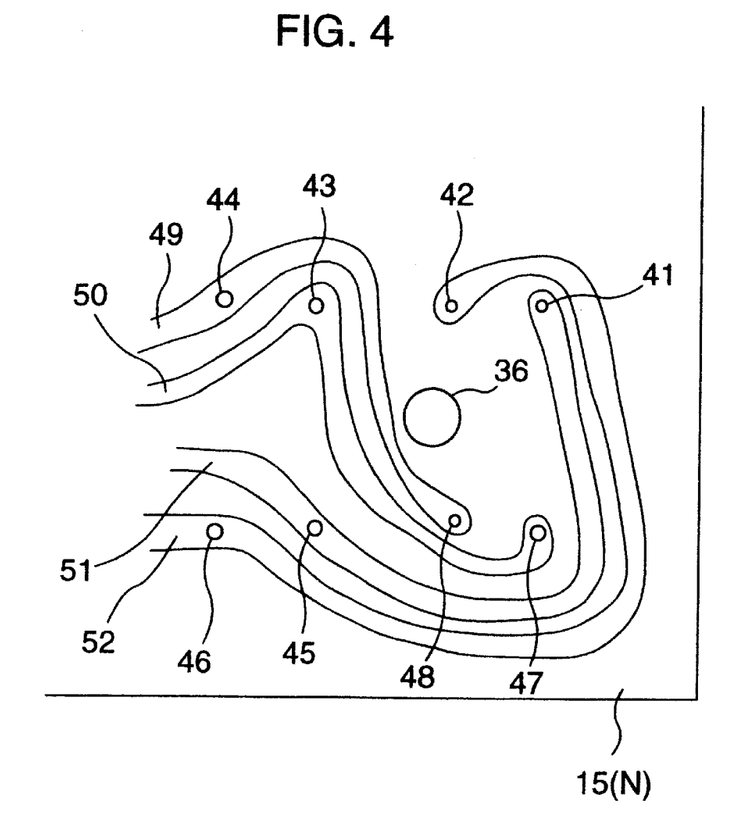
FIG. 4 is a connection pattern diagram of a field coil in the cooling apparatus of the electronic device in accordance with the second embodiment of the present invention.

FIG. 3 is a pattern diagram of a field coil in the cooling apparatus for the electronic device in accordance with the second embodiment of the present invention, and FIG. 4 is a connection pattern diagram of the field coil in the cooling apparatus for the electronic device in accordance with the second embodiment of the present invention. The multiple layered mounting board 16 is constituted by an N-layered printed circuit board 15, and numbers from (1) to (N) are respectively applied to the printed circuit board 15 from a side of the flat rotor 12, successively. FIG. 3 shows the patterns of the field coils 17 of the number from (1) to (N−1) of the printed circuit board 15 by an optional printed circuit board 15 in the number of (N−1). Coil patterns 30, 31, 32 and 33 are spiral patterns each having a fine pitch, and the coil patterns 30, 31, 32 and 33 have the same pitch interval and the same number of turn. In this embodiment, it is set that the coil pitch is 0.2 mm and the number of turns is 40. Reference numerals 18 and 34 denote a through hole provided at both end portions in a start and end portions of the coil pattern 30, reference numerals 35 and 36 denote a through hole provided at both end portions in a start and end portions of the coil pattern 31, reference numerals 37 and 38 denote a through hole provided at both end portions in a start and end portions of the coil pattern 32, and reference numerals 39 and 40 denote a through hole provided at both end portions in a start and end portions of the coil pattern 33. The same coil pattern is formed on the printed circuit board 15 in the number (1) of the printed circuit board 15 to the number (N−1) of the printed circuit board.

However, a hole component for detecting a magnetic pole of the flat rotor 12 is provided beside each of the coil patterns 30, 31, 32 and 33 in the number (1) of the printed circuit board 15 (not shown). Control means (not shown) flows electricity to the stator 19 in accordance with an information of the magnetic pole of the flat rotor 12 detected by the hole component, thereby rotating the cooling fan.

Connection patterns 49, 50, 51 and 52 are formed on the printed circuit board in the number (N) of the printed circuit board 15, and a connection terminal 48 connected to the through hole 40 of the coil pattern 33 and a connection terminal 44 connected to the through hole 36 of the coil pattern 31 are formed in the connection pattern 49. A connection terminal 47 connected to the through hole 39 of the coil pattern 33 and a connection terminal 43 connected to the through hole 35 of the coil pattern 31 are formed in the connection pattern 50. A connection terminal 41 connected to the through hole 18 of the coil pattern 30 and a connection terminal 45 connected to the through hole 37 of the coil pattern 32 are formed in the connection pattern 51. A connection terminal 42 connected to the through hole 34 of the coil pattern 30 and a connection terminal 46 connected to the through hole 38 of the coil pattern 32 are formed in the connection pattern 52. The other end sides of the connection patterns 49, 50, 51 and 52 are connected to the control means.

N sheets of printed circuit boards 15 are layered so as to form a multi-layered mounting board 16. At this time, the through hole 18 formed in (N−1) layers and the connection terminal 41 are electrically connected to each other. In the same manner, the through hole 34 formed in (N−1) layers and the connection terminal 42, the through hole 35 formed in (N−1) layers and the connection terminal 43, the through hole 36 formed in (N−1) layers and the connection terminal 44, the through hole 37 formed in (N−1) layers and the connection terminal 45, the through hole 38 formed in (N−1) layers and the connection terminal 46, the through hole 39 formed in (N−1) layers and the connection terminal 47 and the through hole 40 formed in (N−1) layers and the connection terminal 48 are electrically connected to each other, respectively.

The control means flows electricity to the connection patterns 49, 50, 51 and 52 in accordance with a drive principle of a two-phase motor so as to rotate the cooling fan 20.

In the case of this embodiment, a drive system is based on the two-phase motor, however, even in the case of a three-phase or more, it is possible to form the coil pattern on the basis of the same thought so as to drive, thereby obtaining the same effect, so that the drive system is not limited to the two-phase one.

Further, since the heat transmission structure from the circuit parts 2 to the frame 14 via the heat transmission member 4 is made in the same manner as that of the first embodiment mentioned above, an explanation thereof will be omitted.

In accordance with the structure mentioned above, since the flat stator 19 of the motor portion in the cooling fan 20 is constituted by utilizing the multi-layered mounting board 16, the cooling fan 20 is made compact and the height thereof is made lower at a degree of the thickness of the mounting board, so that the occupied space for the cooling fan within the thin type casing is made significantly small, thereby obtaining the thin type electronic device provided with the cooling fan having a high performance and a high function.

What is claimed is:

1. A cooling apparatus for an electronic device having a multi-layered mounting board comprising integrally laminated plural printed circuit boards disposed in layers, for mounting at least one heat generating part thereon, said cooling apparatus comprising:

a plurality of field coils, respectively arranged on the plural printed circuit boards, each of said plurality of field coils having a beginning and an ending connected by a through hole in one of said printed circuit boards, thereby forming a flat stator;

a casing having a first opening, said casing for housing the multi-layered mounting board therein;

a cooling fan having a frame, said cooling fan being housed in said casing and being mounted on a same surface of the multi-layered mounting board as the at least one heat generating part, said frame having a longitudinal axis and a first end surface mounted to the multi-layered mounting board;

a heat transmission member for thermally connecting the at least one heat generating part with a second end surface of the frame of said cooling fan, said second end surface being disposed at an opposite end of said frame than said first end surface relative to a direction of said longitudinal axis;

said cooling fan having (i) a motor comprising said flat stator and a flat rotor, said flat rotor having a surface opposed to a surface of said flat stator, and (ii) a vane extending radially from said flat rotor of said motor relative to said longitudinal axis;

said cooling fan being disposed in said casing so that a thickness of said cooling fan in said direction of said longitudinal axis is oriented in a direction of thickness of said casing in said direction of said longitudinal axis; and said frame surrounding an outer periphery of said vane and forming a second opening;

wherein said rotor and said stator are mounted on a same side of said multi-layered mounting board.

2. The cooling apparatus according to claim 1, wherein said multi-layered mounting board having said stator integrally formed thereon, and said stator together form a flat plate-like structure.

3. The cooling apparatus according to claim 1, wherein a bearing of the motor of said cooling fan is mounted on said multi-layered mounting board so as to be fixed thereto.

4. The cooling apparatus according to claim 1, wherein a bearing of the motor of said cooling fan is press inserted into said multi-layered mounting board so as to be fixed thereto.

5. A cooling apparatus for an electronic device having a multi-layered mounting board comprising integrally laminated plural printed circuit boards disposed in layers, for mounting at least one heat generating part thereon, said cooling device comprising:

a plurality of field coils, respectively arranged on the plural printed circuit boards, each of said plurality of field coils having a beginning and an ending connected by a through hole in one of said printed circuit boards, thereby forming a flat stator;

a casing having an opening, said casing for housing the multi-layered mounting board therein;

a cooling fan having a frame having a longitudinal axis and being housed in said casing, said cooling fan being mounted directly on a same surface of the multi-layered mounting board as the at least one heat generating part;

a heat transmission member having a first portion for thermally connecting the at least one heat generating part with an end surface of the frame of said cooling fan, and said end surface being disposed at an opposite end of said frame than a part of said frame disposed adjacent to said multi-layered mounting board, relative to a direction of said longitudinal axis;

said cooling fan having (i) a motor of a flat type comprising said flat stator and a flat rotor, said flat rotor having a surface opposed to a surface of said flat stator, and (ii) a vane extending radially from said flat rotor of said motor relative to said longitudinal axis; and said frame surrounding a periphery of said vane and forming a second opening, said frame being disposed in said casing so that said first opening and said second opening are opposed to each other relative to said direction of said longitudinal axis;

wherein said rotor and said stator are mounted on a same side of said multi-layered mounting board.

6. The cooling apparatus according to claim 5, wherein said multi-layered mounting board having said stator integrally formed thereon, and said stator together form a flat plate-like structure.

7. The cooling apparatus according to claim 5, wherein a bearing of the motor of said cooling fan is mounted on said multi-layered mounting board so as to be fixed thereto.

8. The cooling apparatus according to claim 5, wherein a bearing of the motor of said cooling fan is press inserted into said multi-layered mounting board so as to be fixed thereto.

9. A cooling apparatus for an electronic device having a multi-layered mounting board comprising integrally laminated plural printed circuit boards disposed in layers, for mounting at least one heat generating part thereon, said cooling apparatus comprising:

a plurality of field coils, respectively arranged on the plural printed circuit boards, each of said plurality of field coils having a beginning and an ending connected by a through hole in one of said printed circuit boards, thereby forming a flat stator;

a casing for housing the multi-layered mounting board therein;

a cooling fan having a frame, said cooling fan being housed in said casing and being mounted on a same surface of the multi-layered mounting board as the at least one heat generating part;

a heat transmission member having a first portion for thermal connection with the at least one heat generating part;

said cooling fan having a motor comprising said flat stator and a flat rotor, said flat rotor having a surface opposed to a surface of said flat stator and being mounted on said multi-layered mounting board, and a vane extending from said flat rotor of said motor; and said flat rotor being mounted to the multi-layered mounting board; and said heat transmission member comprising a second end in thermal connection with said frame, wherein said frame of said cooling fan and said at least one heat generating part are thermally connected by said heat transmission member.

10. The cooling apparatus according to claim 9, wherein said multi-layered mounting board having said stator integrally formed thereon, and said stator together form a flat plate-like structure.

11. The cooling apparatus according to claim 9, wherein a bearing of the motor of said cooling fan is mounted on said multi-layered mounting board so as to be fixed thereto.

12. The cooling apparatus according to claim 9, wherein a bearing of the motor of said cooling fan is press inserted into said multi-layered mounting board so as to be fixed thereto.

13. A cooling apparatus for an electronic device having a multi-layered mounting board comprising integrally laminated plural printed circuit boards disposed in layers, for mounting at least one heat generating part thereon, said cooling apparatus comprising:

a plurality of field coils, respectively arranged on the plural printed circuit boards, each of said plurality of field coils having a beginning and an ending connected by a through hole in one of said printed circuit boards, thereby forming a flat stator;

a casing having a first opening, said casing for housing the multi-layered mounting board therein;

a cooling fan having a frame and being housed in said casing and being mounted on a same surface of the multi-layered mounting board as the at least one heat generating part;

a heat transmission member having a first portion for thermal connection with the at least one heat generating part;

said cooling fan having a motor comprising said flat stator and a flat rotor, said rotor being mounted on a same side of said multi-layered mounting board, said flat rotor having a surface opposed to a surface of said flat stator, and a vane extending from said flat rotor of said motor;

said frame surrounding a periphery of said vane and forming a second opening, and said frame being arranged so that said first opening and said second opening are opposed to each other, and said heat transmission member comprising a second portion in thermal connection with said frame, wherein said at least one heat transmission member and said frame are thermally connected by said heat transmission member.

14. The cooling apparatus according to claim 13, wherein said multi-layered mounting board having said stator integrally formed thereon, and said stator together form a flat plate-like structure.

15. The cooling apparatus according to claim 13, wherein a bearing of the motor of said cooling fan is mounted on said multi-layered mounting board so as to be fixed thereto.

16. The cooling apparatus according to claim 13, wherein a bearing of the motor of said cooling fan is press inserted into said multi-layered mounting board so as to be fixed thereto.

* * * * *

UNITED STATES PATENT AND TRADEMARK OFFICE
CERTIFICATE OF CORRECTION

PATENT NO. : 6,351,044 B1
DATED : February 26, 2002
INVENTOR(S) : Miyahara

It is certified that error appears in the above-identified patent and that said Letters Patent is hereby corrected as shown below:

<u>Title page</u>,
Delete "[*] Notice: Subject to any disclaimer, the term of this patent is extended or adjusted under 35 U.S.C. 154(b) by 0 days."

Signed and Sealed this

Second Day of July, 2002

Attest:

JAMES E. ROGAN
Attesting Officer
Director of the United States Patent and Trademark Office

UNITED STATES PATENT AND TRADEMARK OFFICE
CERTIFICATE OF CORRECTION

PATENT NO. : 6,351,044 B1  Page 1 of 1
DATED : February 26, 2002
INVENTOR(S) : Miyahara It is certified that error appears in the above-identified patent and that said Letters Patent is hereby corrected as shown below:

<u>Title page,</u>
"[*] Notice: Subject to any disclaimer, the term of this patent is extended or adjusted under 35 U.S.C. 154(b) by 0 days."

This certificate supersedes Certificate of Correction issued July 2, 2002.

Signed and Sealed this

Seventeenth Day of December, 2002

JAMES E. ROGAN
*Director of the United States Patent and Trademark Office*